United States Patent
Ausschnitt et al.

(10) Patent No.: US 6,975,398 B2
(45) Date of Patent: Dec. 13, 2005

(54) METHOD FOR DETERMINING SEMICONDUCTOR OVERLAY ON GROUNDRULE DEVICES

(75) Inventors: Christopher P. Ausschnitt, Lexington, MA (US); William A. Muth, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 548 days.

(21) Appl. No.: 09/977,793

(22) Filed: Oct. 15, 2001

(65) Prior Publication Data

US 2003/0071997 A1 Apr. 17, 2003

(51) Int. Cl.$^7$ ............................................. G01B 11/00
(52) U.S. Cl. ....................................... 356/400; 430/22
(58) Field of Search ............................................. 430/22

(56) References Cited

U.S. PATENT DOCUMENTS

| | | | |
|---|---|---|---|
| 4,568,189 A | 2/1986 | Bass et al. | |
| 4,848,911 A | 7/1989 | Uchida et al. | |
| 5,343,292 A | 8/1994 | Brueck et al. | |
| 5,545,593 A | 8/1996 | Watkins et al. | |
| 5,629,772 A | 5/1997 | Ausschnitt | |
| 5,712,707 A | 1/1998 | Ausschnitt et al. | |
| 5,731,877 A | 3/1998 | Ausschnitt | |
| 5,756,242 A | 5/1998 | Koizumi et al. | |
| 5,757,507 A | 5/1998 | Ausschnitt et al. | |
| 5,776,645 A * | 7/1998 | Barr et al. ..................... | 430/22 |
| 5,790,254 A | 8/1998 | Ausschnitt | |
| 5,805,290 A | 9/1998 | Ausschnitt et al. | |
| 5,877,861 A | 3/1999 | Ausschnitt et al. | |
| 5,914,784 A | 6/1999 | Ausschnitt et al. | |
| 5,928,822 A | 7/1999 | Rhyu | |
| 5,949,547 A | 9/1999 | Tseng et al. | |
| 5,952,134 A | 9/1999 | Hwang | |
| 5,953,128 A | 9/1999 | Ausschnitt et al. | |
| 5,965,309 A | 10/1999 | Ausschnitt et al. | |
| 5,968,693 A | 10/1999 | Adams | |
| 5,976,740 A | 11/1999 | Ausschnitt et al. | |
| 5,981,119 A | 11/1999 | Adams | |
| 5,982,044 A * | 11/1999 | Lin et al. ..................... | 257/797 |
| 5,985,495 A | 11/1999 | Okumura et al. | |
| 6,003,223 A | 12/1999 | Hagen et al. | |
| 6,004,706 A | 12/1999 | Ausschnitt et al. | |
| 6,020,966 A | 2/2000 | Ausschnitt et al. | |
| 6,027,842 A | 2/2000 | Ausschnitt et al. | |
| 6,042,976 A | 3/2000 | Chiang et al. | |
| 6,077,756 A * | 6/2000 | Lin et al. ..................... | 438/401 |
| 6,128,089 A | 10/2000 | Ausschnitt et al. | |
| 6,130,750 A | 10/2000 | Ausschnitt et al. | |
| 6,137,578 A | 10/2000 | Ausschnitt | |
| 6,183,919 B1 | 2/2001 | Ausschnitt et al. | |
| 6,251,745 B1 * | 6/2001 | Yu ..................... | 438/401 |
| 6,317,211 B1 | 11/2001 | Ausschnitt et al. | |
| 6,346,979 B1 | 2/2002 | Ausschnitt et al. | |
| 6,350,548 B1 * | 2/2002 | Leidy et al. ..................... | 430/22 |
| 6,436,595 B1 * | 8/2002 | Credendino ..................... | 430/22 |

* cited by examiner

Primary Examiner—Frank G. Font
Assistant Examiner—Willie Davis
(74) Attorney, Agent, or Firm—DeLio & Peterson, LLC; Peter W. Peterson; Todd M. C. Li

(57) ABSTRACT

A method of determining overlay error comprises creating a first and second layers of an integrated circuit, each having an active circuit feature and an adjacent kerf area. Each kerf area includes a first measurement feature separated from and corresponding substantially to the layer's active circuit feature. The circuit and kerf areas of the layers are substantially superimposed. The distance of separation between the active circuit feature and the layer kerf measurement feature in each layer in the direction of overlay error is the same. The second layer kerf measurement feature is displaced from the first layer kerf measurement feature in a direction perpendicular to the direction that the overlay error is to be determined. Overlay error is determined by measuring distance of separation in the direction of overlay error between the common points of reference of each of the first and second layer kerf measurement features.

20 Claims, 4 Drawing Sheets

METHOD FOR DETERMINING SEMICONDUCTOR OVERLAY ON GROUNDRULE DEVICES

BACKGROUND OF THE INVENTION

1. Field of the Invention

The present invention relates to the manufacture of integrated circuits and, in particular, to a method and system for determining overlay error between circuit layers made by a lithographic process.

2. Description of Related Art

Semiconductor manufacturing involves the printing of multiple integrated circuit patterns using lithographic methods on successive levels of exposure tools. A requirement of semiconductor manufacturing is to keep the alignment of each level to previous levels below product tolerance. Currently this is done using the optical microscope based tool that measures structures printed in the field kerf outside the product cell that comprises the printed circuit pattern. The field kerf is the area which separates the individual cells or patterns and which is unusable due to the width of the blade used to cut apart the cells or patterns upon completion of the printing. These structural features printed in the field kerf must be larger than the printed circuit pattern to enable the low resolution to image and make measurements of the current to prior level alignment.

Kerf to device overlay error prediction is an industry wide issue. A problem of conventional overlay metrology technique is that the printed structure used in the measurement is printed at a much larger size and different shape than that of the printed circuit. Due to the physics of optical lithography, mask making and the like, this can lead to errors in the measured structure overlay to that of the printed circuit overlay. In addition, typical high resolution methods of measuring in-chip overlay such as scanning electron microscopy (SEM) are complicated by the required direct placement of subsequent patterns on top of each other. This leads to difficulty or even impossibility of measuring the overlay directly in the product chip device since the structures typically sit on top of each other and it may be difficult to discern an edge of a device feature on one level from an edge of a device feature on another level. At sub 0.3 $\mu$m ground rules, the magnitude of the problem starts to become a potentially significant contribution to yield loss due to overlay error.

Bearing in mind the problems and deficiencies of the prior art, it is therefore an object of the present invention to provide an improved system and method for determining overlay error between different lithographically produced layers of an integrated circuit chip.

It is another object of the present invention to provide a system and method for determining overlay error between superimposed active circuit features on different lithographically produced layers of an integrated circuit chip.

A further object of the invention is to provide a system and method for determining overlay error that avoids the problem of discerning different superimposed active circuit features on different lithographically produced layers of an integrated circuit chip.

It is yet another object of the present invention to provide such a system and method for determining overlay error that does not reduce the amount of active circuit area on a semiconductor wafer.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of determining overlay error in a desired direction in an integrated circuit made by a lithographic process. The method includes creating a first layer of the integrated circuit having at least one circuit area, the first layer circuit area including a first active circuit feature and a kerf area adjacent to the circuit area substantially free of active circuit features. The first layer kerf area includes a first measurement feature corresponding substantially to the first layer active circuit feature and which is separated from the first layer active circuit feature by a distance. The method also includes creating a second layer of the integrated circuit having at least one circuit area, the second layer circuit area including a second active circuit feature and a kerf area adjacent to the circuit area substantially free of active circuit features. The circuit and kerf areas of the first and second layers are substantially superimposed. The second layer kerf area includes a second measurement feature corresponding substantially to the second layer active circuit feature and which is separated therefrom by a distance. The distance of separation between the separated second layer active circuit feature and the second layer kerf measurement feature in the direction that the overlay error is to be determined is the same as the distance of separation between the separated first layer active circuit feature and the first layer kerf measurement feature in such direction. The second layer kerf measurement feature is displaced from the first layer kerf measurement feature compared to the first and second active circuit features in a direction perpendicular to the direction that the overlay error is to be determined. The method then includes determining a common point of reference of each of the first and second layer kerf measurement features, and measuring distance of separation in the direction of overlay error between the common points of reference of each of the first and second layer kerf measurement features to determine overlay error of the first and second active circuit features.

In another aspect, the present invention is directed to an integrated circuit wafer adapted to measure overlay error between layers made by a lithographic process. The wafer includes a first layer of the integrated circuit having at least one circuit area. The first layer circuit area includes a first active circuit feature and a kerf area adjacent to the circuit area substantially free of active circuit features. The first layer kerf area includes a first measurement feature corresponding substantially to the first layer active circuit feature and which is separated from the first layer active circuit feature by a distance. The wafer also includes a second layer of the integrated circuit having at least one circuit area. The second layer circuit area includes a second active circuit feature and a kerf area adjacent to the circuit area substantially free of active circuit features. The circuit and kerf areas of the first and second layers are substantially superimposed. The second layer kerf area includes a second measurement feature corresponding substantially to the second layer active circuit feature and separated therefrom by a distance. The distance of separation between the separated second layer active circuit feature and the second layer kerf measurement feature in the direction that the overlay error is to be determined is the same as the distance of separation between the separated first layer active circuit feature and the first layer kerf measurement feature in such direction. The second layer kerf measurement feature is displaced from the first layer kerf measurement feature compared to the first and second active circuit features in a direction perpendicular to the direction that the overlay error is to be determined. Common points of reference of each of the first and second layer kerf measurement features are determinable to permit measurement of any separation between the common points of reference of each of the first and second layer kerf measurement features to determine overlay error.

In the method and wafer of the present invention, preferably the first and second active circuit features corresponding to the first and second layer kerf measurement features are in contact with each other. The first and second layers of the integrated circuit each may have a plurality of circuit areas separated by kerf areas. Preferably, the second layer kerf measurement feature is displaced from the first layer kerf measurement feature by a distance sufficient to distinguish the corresponding active features in the circuit area so that the first and second layer kerf measurement features are more easily discerned. The common points of reference of the first and second layer kerf measurement features may comprise centerlines or edges of the features. The measurement features in the kerf areas are adapted to be destroyed when the plurality of circuit areas are cut apart.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(s)

Figure 1:
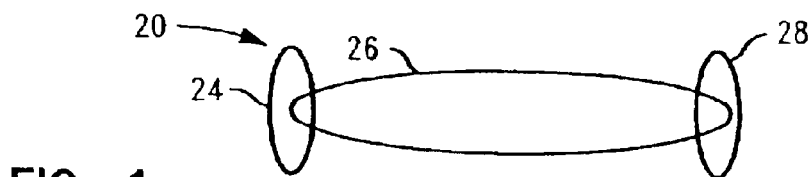
FIG. 1 is a top plan view of one embodiment of an active integrated circuit structure made up of components formed on two different layers with proper alignment.

In describing the preferred embodiment of the present invention, reference will be made herein to FIGS. 1–14 of the drawings in which like-numerals refer to like features of the invention. Features of the invention are not necessarily shown to scale in the drawings.

In order to easily correlate the conventional overlay measurement to device overlay, the present invention provides a system and method of representing a measurable device structure in the kerf area, between the printed functional circuit areas, to aid in direct device overlay measurement. The present invention is based on a method that allows the overlay to be determined on circuit size and shaped device patterns without the difficulty related to pattern-on-pattern placement. To accomplish this, in the preferred embodiment the device design itself is printed in the kerf, with two patterns being printed not on top of each other, but physically separated in at least one dimension. This permits the use of high resolution microscopy to measure edge or centerline overlay error without the confluence of edges. The preferred kerf measurement structures use the actual device design, displaced relative to each other allowing easily discernible edges of each structure. They are still located symmetrically about each other such that conventional edge or centerline overlay measurements may still be made.

A typical pattern made in a dynamic random access memory (DRAM) chip is made up of a plurality of active circuit areas separated by the kerf areas, also known as streets. A typical memory device cell has many active areas that need to be aligned between different lithographically produced levels. In practice, however, the active circuit areas on one level may misalign with respect to active circuit areas on another level and cause short and/or open circuits. To obtain an error measurement of how far the different levels are displaced, the present invention takes the same structure or design features as in the active circuit area, or structures that are substantially corresponding to them, and actually places them in the kerf region and separates them in one dimension. The separation need not be a known amount, so long as the two edges on the two different layers can be clearly discerned and one can determine a centerline estimate of overlay misalignment.

By a substantially corresponding structure or design feature is meant that the structure or design feature is substantially replicated with respect to the features in issue, for example edges, and under the same design rule. Preferably, the kerf measurement feature is reproduced as closely as practical, and more preferably the kerf measurement feature replicates the size and pitch of the corresponding active feature in the circuit pattern, as well as its shape and its proximity to other structures, as closely as possible. Thus, the kerf measurement feature corresponds substantially to the corresponding active circuit feature.

In accordance with the present invention, instead of overlaying the measurement features from different layers on top of each other in the kerf area, they are displaced or separated by some amount, in a direction normal to the direction of overlay error measurement, such that one can easily more obtain a measurement of what the overlay misalignment is between them. The location in the kerf measurement structure is not normally important in practicing the present invention, and can be at random in various places, or it can be at one set reference location. A kerf measurement structure is separated from its corresponding similar active structure in the circuit area on each level, and the degree of separation in one of the x- or y-dimension is by the same distance. Further, each layer's kerf measurement structure should be displaced or separated in the dimension 90° or perpendicular to the direction of overlay error measurement so that the edges can be clearly identified for each layer, and the measurement structures of the two layers are not superimposed upon each other. The two kerf measurement features on the different layers need not be completely separated, but should be displaced by some amount so that features on each can be distinguished. For example, where the overlay error measurement is to be made in the y-dimension, the amount of the x-dimension separation is immaterial, as long as the kerf measurement features of the two layers which are difficult to discern in the active structure are physically displaced or separated in the kerf by a sufficient distance so that the separate layer features are easier to discern. However, in each layer the distance of separation or offset between the active feature in the circuit pattern and the measurement feature in the kerf area, in the direction of the offset error measurement (e.g., the y-direction), has to be identical. This distance of separation in the direction of overlay error measurement may range from zero to any maximum that enables the active circuit structures and the corresponding kerf measurement structures to fit on the wafer.

A first example of the present invention is depicted in FIGS. 1–4 which shows active circuit structures 20 and 22, in an integrated circuit product cell on a semiconductor wafer, of the type that may be created in two separate photolithographically processed layers. Active structure 20 comprises an active circuit component 26 extending in a horizontal direction printed on one layer which is overlapped on each end by trenches 24, 28 created on a different layer, either over or under the layer of component 26. Likewise, active circuit structure 22 comprises a similar active circuit component 32 which is overlapped and superimposed on each end by trench structures 30, 34 created on a different layer, on either over or under the layer of component 32. As shown in FIG. 1, the vertical or y-direction alignment of the trench structures with respect to each of the active components in active structures 20 and 22 appears to be within limits and, in any event, is relatively easy to discern because the edges of each active component and trench structure are clearly distinct.

Figure 2:
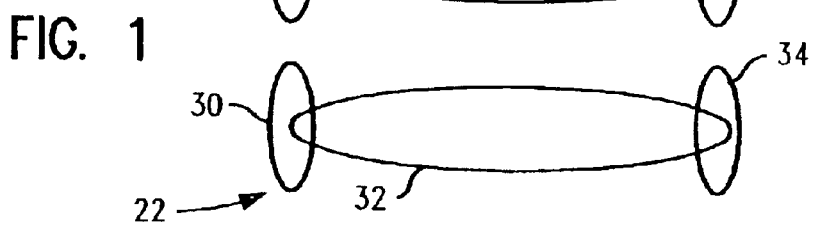
FIG. 2 is a top plan view of the active integrated circuit structure of FIG. 1 with the different layer components misaligned.

However, in FIG. 2, there is shown a misalignment in the vertical or y direction (the direction of overlay error measurement) between each of the trenches and active components in each of the active structures 20 and 22. This misalignment makes the overlay error in the y direction difficult to discern because one must first locate the top and bottom edges of the trenches and the top and bottom edges of the active components in order to determine the midpoints of each, and then compare the midpoints to determine overlay error. The upper edge 28a and lower edge 28b of trench 28 must be identified and located in order to determine the midpoint 28c in the y dimension. Likewise, the upper edge 26a and lower edge 26b of active component 26 must be identified and located in order to determine the midpoint 26c. Because of the misalignment, it is difficult to distinguish the upper edge 28a of trench 28 from the upper edge 26a of active component 26. When attempting to measure overlay error directly from the active components themselves within the chip pattern, this will lead to difficulties.

Figure 3:
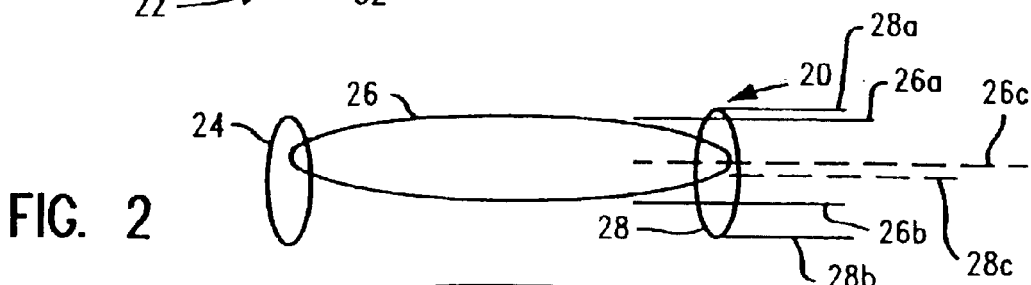
FIG. 3 is a top plan view of a measurement structure corresponding substantially to the active integrated circuit structure of FIG. 1, formed in the wafer kerf area and having the different layer components displaced.
Figure 4:
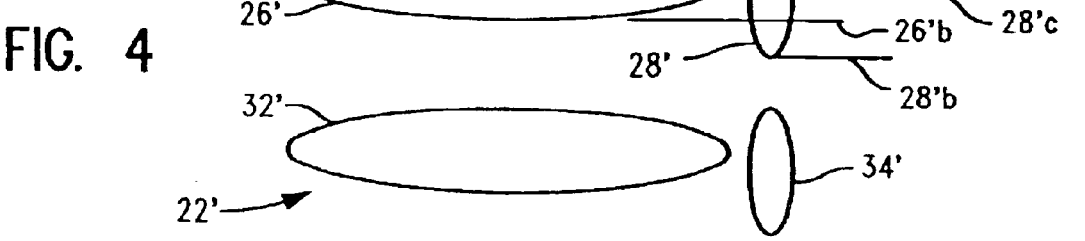
FIG. 4 is a top plan view of a measurement structure corresponding substantially to the misaligned active integrated circuit structure of FIG. 2, formed in the wafer kerf area and having the different layer components displaced.

In accordance with the present invention, kerf measurement features 20', 22' are formed in the kerf area adjacent to the circuit area which substantially correspond to and are representative of active features 20, 22, respectively, in the active circuit area. As shown in FIG. 3, the kerf measurement structures 20', 22' differ from the corresponding active structures 20, 22 in that the active components 26', 32' are separated horizontally (the direction perpendicular to the error overlay measurement) from the trench components 28', 34'. This enables the edge and centerlines of each of the active component and trench structures to be more easily identified and distinguished. These edges and centerlines provide common points of reference for measuring separation, although other common points of reference may be used. While this is useful for the kerf measure structures of FIG. 3, which correspond to the relatively good alignment shown in FIG. 1, it is more important and advantageous for the kerf measurement structures in FIG. 4, which correspond to the misaligned active structures in FIG. 2. As shown in FIG. 4, it is considerably easier to discern and distinguish the edges, and therefore the centerlines, between the active component 26' on one layer and the trench 28' on another. As shown, the trench upper and lower edges 28'a, 28'b are easily discerned in order to calculate the centerline 28'c of the trench 28'. Likewise, the upper and lower edges 26'a and 26'b of the active component 26' are easily discerned in order calculate the active component centerline 26'c. It is then a relatively easy measurement, for example utilizing a high resolution instrument such as an SEM, to determine the overlay error between the respectively centerlines of the trench and active component in the kerf area, 28'c and 26'c.

Figure 5:
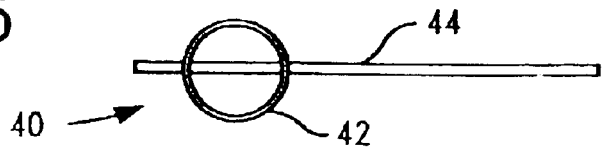
FIG. 5 is a top plan view of a second embodiment of an active integrated circuit structure made up of components formed on two different layers with proper alignment.
Figure 6:
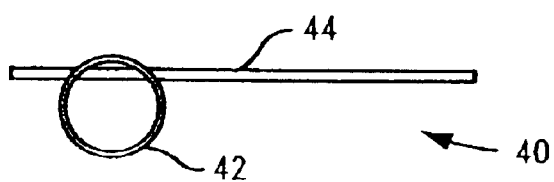
FIG. 6 is a top plan view of the active integrated circuit structure of FIG. 5 with the different layer components misaligned.
Figure 7:
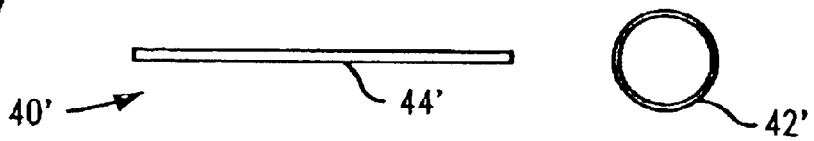
FIG. 7 is a top plan view of a measurement structure corresponding substantially to the active integrated circuit structure of FIG. 5, formed in the wafer kerf area and having the different layer components displaced.
Figure 8:
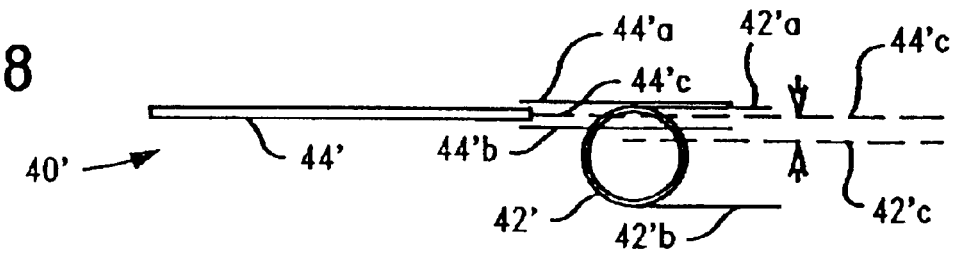
FIG. 8 is a top plan view of a measurement structure corresponding substantially to the misaligned active integrated circuit structure of FIG. 6, formed in the wafer kerf area and having the different layer components displaced.

Another example of the corresponding active circuit features and kerf measurement features is shown in FIGS. 5–8. In FIGS. 5 and 6, the active circuit feature 40 within the active circuit area comprises a contact hole 42 on one lithographically created layer superimposed over or under metal line 44 on another lithographically created layer. While the alignment of the two structures is acceptable in FIG. 5, in FIG. 6 the two structures are clearly misaligned, and it is difficult to discern the top edge of contact hole 42 from the top edge of metal line 44. As shown in FIGS. 7 and 8, a corresponding kerf measurement structure 40' comprises a metal line 44' on the same lithographic layer as active metal line 44, and contact hole 42' on the same lithographic layer as active contact hole 42. In both FIGS. 7 and 8, rather than being superimposed as in the active structure 40, the metal line 44' and contact hole 42' are separated in the x direction, the direction perpendicular to the direction of measurement of overlay error. In FIG. 8, this separation is particularly useful because of the misalignment described previously in connection with FIG. 6. As shown in FIG. 8, the top and bottom edges 44'a and 44'b of metal line 44' are easily discerned to determine the centerline 44'c. Likewise the top and bottom edges 42'a and 42'b of contact hole 42' are easily discerned to determine the centerline 42'c. Subsequently the amount of overlay error may be determined by measuring the distance between centerlines 42'c and 44'c, shown by the two arrows.

Figure 9:
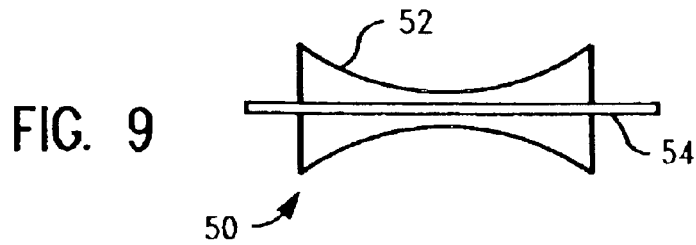
FIG. 9 is a top plan view of a third embodiment of an active integrated circuit structure made up of components formed on two different layers with proper alignment.
Figure 10:
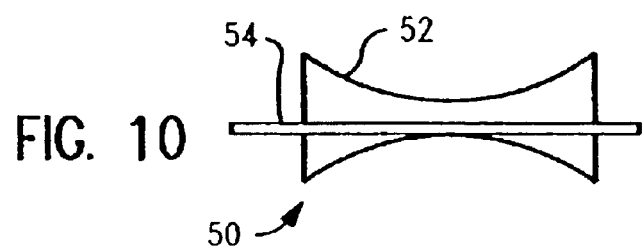
FIG. 10 is a top plan view of the active integrated circuit structure of FIG. 9 with the different layer components misaligned.
Figure 11:
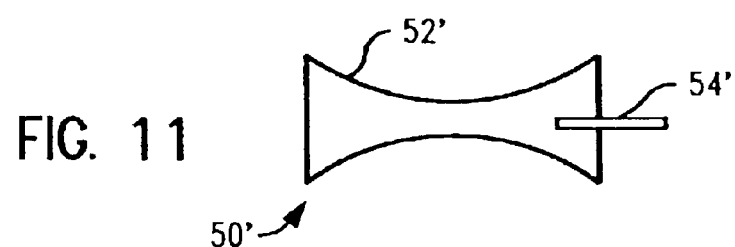
FIG. 11 is a top plan view of a measurement structure corresponding substantially to the active integrated circuit structure of FIG. 9, formed in the wafer kerf area and having the different layer components displaced.
Figure 12:
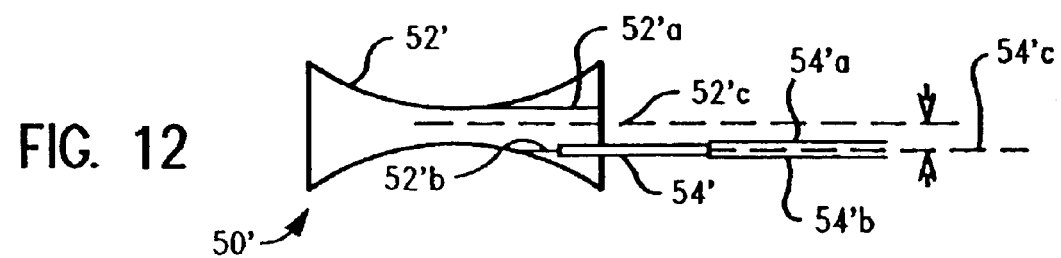
FIG. 12 is a top plan view of a measurement structure corresponding substantially to the misaligned active integrated circuit structure of FIG. 10, formed in the wafer kerf area and having the different layer components displaced.

A third example of the present invention is shown in FIGS. 9–12 wherein an active device 50 is comprised of active structure 52 and metal line 54. As before, FIG. 9 shows a proper alignment between the two, made on different lithographic levels, whereas in FIG. 10, there is a misalignment between active component 52 and line 54. Because the edge of line 54 is near to the edge of the active component 52 it is difficult to discern the edges of the two features made on different levels in the active area depicted in FIG. 10. As shown in FIGS. 11 and 12, corresponding kerf measurement structure 50' comprises an active component 52' and metal line 54'. Kerf measurement 54' is displaced from kerf measurement structure 52' in a horizontal direction (perpendicular to the direction of overlay error measurement), as compared to the relationship of active structure 52 and metal line 54 in the active circuit feature 50. FIGS. 11 and 12 illustrate that the two kerf measurement features 52', 54' need not be physically separated, as was the case in FIGS. 3, 4 and 7, but need only be displaced by some amounts so that their respective edges are easily discerned. As shown in FIG. 12, the misalignment of the active structure 50 shown in FIG. 10 is easily determined by first measuring the edges of kerf measure structure 52'a and 52'b, and determining the centerline 52'c of structure 52', and comparing that centerline to the centerline of 54'c of metal line 54'. Again, the overlay error is shown as the distance between the two arrows, and is in a direction perpendicular to the displacement of the two structures in the kerf measurement area compared to their relationship in the active circuit area.

Figure 13:
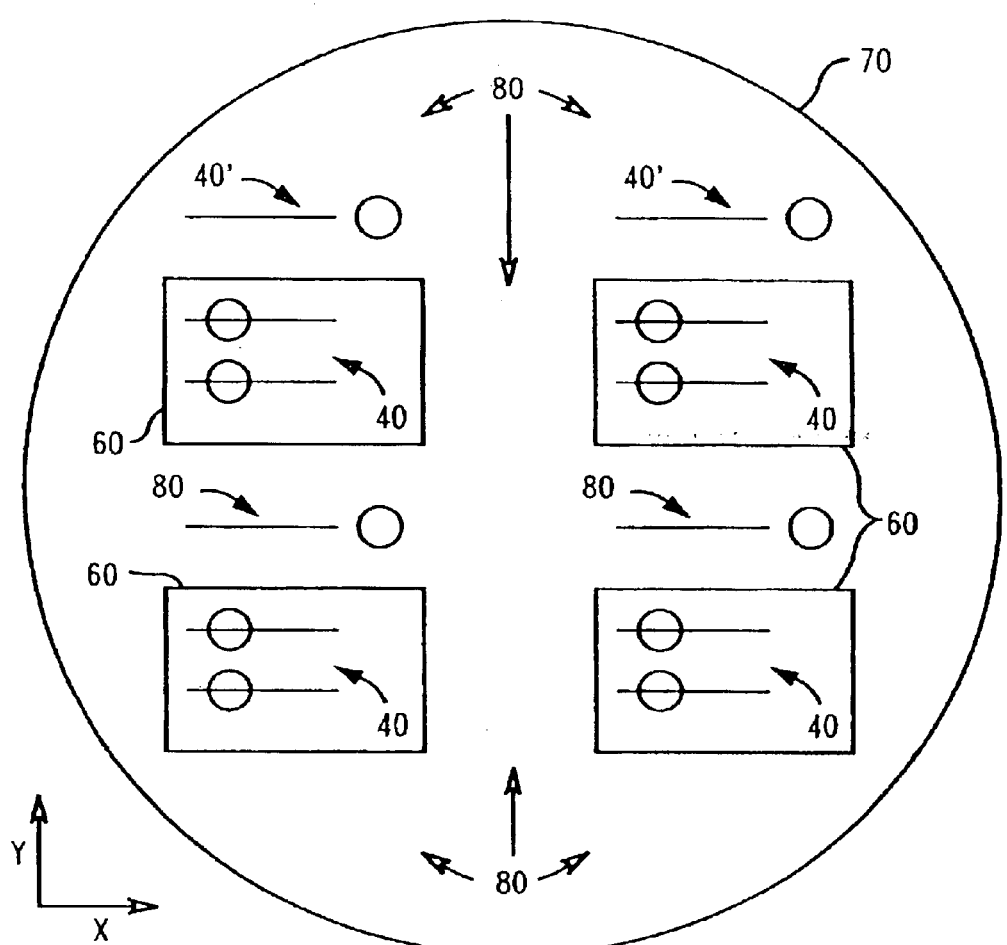
FIG. 13 is a top plan view of a silicon wafer showing the second embodiment active circuit structures inside the individual product cells and the corresponding overlay measurement structures in the kerf areas separating the product cells.
Figure 14:
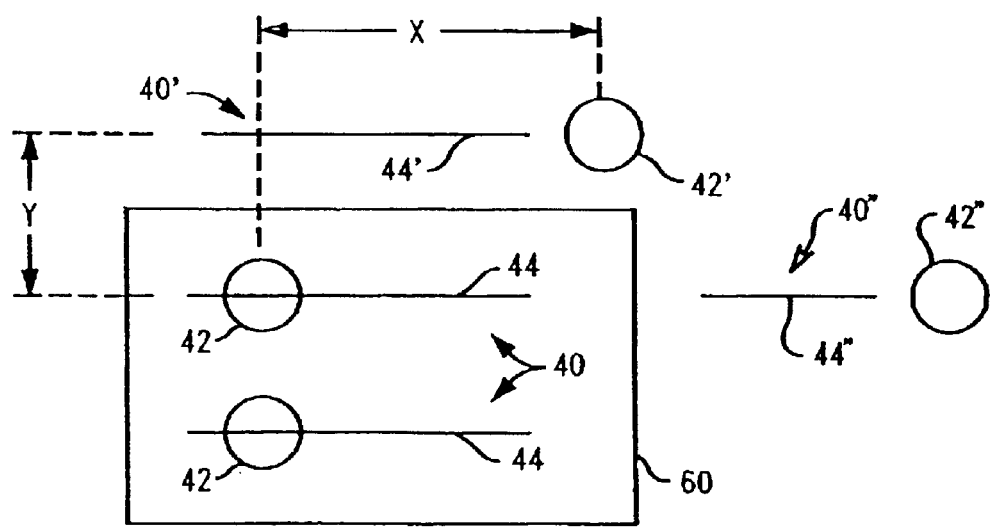
FIG. 14 is a close up showing one product cell containing the active circuit structures and one corresponding kerf measurement structure.

An example of the placements of the corresponding active circuit features and kerf measurement features on an integrated circuit wafer is shown in FIGS. 13 and 14. Wafer 70 contains a plurality of integrated circuit areas or product cells 60 each including a plurality of active circuit features 40. Kerf areas 80, located between and adjacent to product cells 60, will eventually be cut and destroyed by the blade used to cut apart the individual product cells 60. For overlay error to be measured in the y-direction as shown, individual kerf measurement structures 40' are placed so that each of the individual features are a pre-determined distance Y from the corresponding active circuit features. For example, as shown in FIG. 14, kerf measurement feature 40' has metal line component 44' produced on the same layer as, and a distance Y in the y-direction from, active feature metal line component 44. On a different layer are kerf measurement contact hole 42' and the corresponding active circuit contact hole 42, each separated by the same distance Y. Although the kerf measurement feature 40' is shown displaced in the y direction from the corresponding active circuit feature 40, there need be no displacement in the y direction or other direction in which overlay measurement is to be determined since the kerf measurement features can be placed horizontally adjacent to the active surface features at a y distance of 0. This is shown as corresponding kerf measurement structure 40" in FIG. 14. In each instance the kerf measurement contact hole 42', 42" is shown displaced relative to kerf measurement metal line 44', 44" by a distance X relative to the placement to the corresponding contact hole and metal line in active circuit feature 40.

Accordingly, the present invention provides an improved system and method for determining overlay error between different lithographically produced layers of an integrated circuit chip, particularly for determining overlay error between superimposed active circuit features on different layers of an integrated circuit chip. It overcomes the problem of discerning different superimposed active circuit features on different lithographically produced layers of an integrated circuit chip, yet does not reduce the amount of active circuit area on a semiconductor wafer. By the present invention, edges of features on different layers which are difficult to discern in active circuit areas are readily discerned in the kerf measurement structures used for overlay error measurement.

While the present invention has been particularly described, in conjunction with a specific preferred embodiment, it is evident that many alternatives, modifications and variations wilt be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of determining overlay error in an integrated circuit made by a lithographic process comprising:

creating a first layer of the integrated circuit having at least one circuit area including a first active circuit feature and a kerf area adjacent to the circuit area substantially free of active circuit features, the first layer kerf area including a first measurement feature corresponding substantially to the first layer active circuit feature and separated from the first layer active circuit feature by a distance, the first measurement feature replicating a feature of the corresponding first layer active circuit feature selected from the group consisting of size, pitch and shape of the first layer active circuit feature and proximity of the first layer active circuit feature to any other structure;

creating a second layer of the integrated circuit having at least one circuit area including a second active circuit feature and a kerf area adjacent to the circuit area substantially free of active circuit features, the circuit and kerf areas of the first and second layers being substantially superimposed, the second layer kerf area including a second measurement feature corresponding substantially to the second layer active circuit feature and separated therefrom by a distance, the second measurement feature replicating a feature of the corresponding second layer active circuit feature selected from the group consisting of size, pitch and shape of the second layer active circuit feature and proximity of the second layer active circuit feature to any other structure, the distance of separation between the separated second layer active circuit feature and the second layer kerf measurement feature in the direction that the overlay error is to be determined being the same as the distance of separation between the separated first layer active circuit feature and the first layer kerf measurement feature in such direction, the second layer kerf measurement feature being displaced from the first layer kerf measurement feature compared to the first and second active circuit features in a direction perpendicular to the direction that the overlay error is to be determined;

determining a common point of reference of each of the first and second layer kerf measurement features; and measuring distance of separation in the direction of overlay error between the common points of reference of each of the first and second layer kerf measurement features to determine overlay error of the first and second active circuit features.

2. The method of claim 1 wherein the first and second active circuit features corresponding to the first and second layer kerf measurement features contact each other.

3. The method of claim 1 wherein the first and second layers of the integrated circuit each have a plurality of circuit areas separated by kerf areas.

4. The method of claim 1 wherein the second layer kerf measurement feature is displaced from the first layer kerf measurement feature by a distance sufficient to distinguish the corresponding active features in the circuit area so that the first and second layer kerf measurement features are more easily discerned.

5. The method of claim 1 further including cutting apart the plurality of circuit areas and destroying measurement features in the kerf areas.

6. The method of claim 1 wherein the common points of reference of the first and second layer kerf measurement features comprise centerlines of the features.

7. The method of claim 1 wherein the common points of reference of the first and second layer kerf measurement features comprise edges of the features.

8. A method of determining overlay error in a desired direction in an integrated circuit made by a lithographic process comprising:

creating a first layer of the integrated circuit having at least one circuit area including a first active circuit feature and a kerf area adjacent to the circuit area substantially free of active circuit features, the first layer kerf area including a first measurement feature corresponding substantially to the first layer active circuit feature and separated from the first layer active circuit feature by a distance, the first measurement feature replicating a feature of the corresponding first layer active circuit feature selected from the group consisting of size, pitch and shape of the first layer active circuit feature and proximity of the first layer active circuit feature to any other structure;

creating a second layer of the integrated circuit having at least one circuit area including a second active circuit feature and a kerf area adjacent to the circuit area substantially free of active circuit features, the circuit and kerf areas of the first and second layers being substantially superimposed and the second active circuit feature contacting the first active circuit feature, the second layer kerf area including a second measurement feature corresponding substantially to the second layer active circuit feature and separated therefrom by a distance, the second measurement feature replicating a feature of the corresponding second layer active circuit feature selected from the group consisting of size, pitch and shape of the second layer active circuit feature and proximity of the second layer active circuit feature to any other structure, the distance of separation between the separated second layer active circuit feature and the second layer kerf measurement feature in the direction that the overlay error is to be determined being the same as the distance of separation between the separated first layer active circuit feature and the first layer kerf measurement feature in such direction, the second layer kerf measurement feature being displaced from the first layer kerf measurement feature compared to the first and second active circuit features in a direction perpendicular to the direction that the overlay error is to be determined;

determining a common point of reference of each of the first and second layer kerf measurement features; and measuring distance of separation in the direction of overlay error between the common points of reference of each of the first and second layer kerf measurement features to determine overlay error of the first and second active circuit features.

9. The method of claim 8 wherein the first and second layers of the integrated circuit each have a plurality of circuit areas separated by kerf areas.

10. The method of claim 8 wherein the second layer kerf measurement feature is displaced from the first layer kerf measurement feature by a distance sufficient to distinguish the corresponding active features in the circuit area so that the first and second layer kerf measurement features are more easily discerned.

11. The method of claim 8 further including cutting apart the plurality of circuit areas and destroying measurement features in the kerf areas.

12. The method of claim 8 wherein the common points of reference of the first and second layer kerf measurement features comprise centerlines of the features.

13. The method of claim 8 wherein the common points of reference of the first and second layer kerf measurement features comprise edges of the features.

14. An integrated circuit wafer adapted to measure overlay error between layers made by a lithographic process comprising:

a first layer of the integrated circuit having at least one circuit area including a first active circuit feature and a kerf area adjacent to the circuit area substantially free of active circuit features, the first layer kerf area including a first measurement feature corresponding substantially to the first layer active circuit feature and separated from the first layer active circuit feature by a distance, the first measurement feature replicating a feature of the corresponding first layer active circuit feature selected from the group consisting of size, pitch and shape of the first layer active circuit feature and proximity of the first layer active circuit feature to any other structure;

a second layer of the integrated circuit having at least one circuit area including a second active circuit feature and a kerf area adjacent to the circuit area substantially free of active circuit features, the circuit and kerf areas of the first and second layers being substantially superimposed, the second layer kerf area including a second measurement feature corresponding substantially to the second layer active circuit feature and separated therefrom by a distance, the second measurement feature replicating a feature of the corresponding second layer active circuit feature selected from the group consisting of size, pitch and shape of the second layer active circuit feature and proximity of the second layer active circuit feature to any other structure, the distance of separation between the separated second layer active circuit feature and the second layer kerf measurement feature in the direction that the overlay error is to be determined being the same as the distance of separation between the separated first layer active circuit feature and the first layer kerf measurement feature in such direction, the second layer kerf measurement feature being displaced from the first layer kerf measurement feature compared to the first and second active circuit features in a direction perpendicular to the direction that the overlay error is to be determined;

common points of reference of each of the first and second layer kerf measurement features being determinable to permit measurement of any separation between the common points of reference of each of the first and second layer kerf measurement features to determine overlay error.

15. The wafer of claim 14 wherein the first and second active circuit features corresponding to the first and second layer kerf measurement features are in contact with each other.

16. The wafer of claim 14 wherein the first and second layers of the integrated circuit each have a plurality of circuit areas separated by kerf areas.

17. The wafer of claim 14 wherein the second layer kerf measurement feature is displaced from the first layer kerf measurement feature by a distance sufficient to distinguish the corresponding active features in the circuit area so that the first and second layer kerf measurement features are more easily discerned.

18. The wafer of claim 14 wherein the measurement features in the kerf areas are adapted to be destroyed when the plurality of circuit areas are cut apart.

19. The wafer of claim 14 wherein the common points of reference of the first and second layer kerf measurement features comprise centerlines of the features.

20. The wafer of claim 14 wherein the common points of reference of the first and second layer kerf measurement features comprise edges of the features.

* * * * *